US009269705B2

(12) United States Patent
Kimber et al.

(10) Patent No.: US 9,269,705 B2
(45) Date of Patent: Feb. 23, 2016

(54) ANTI-SNAPBACK CIRCUITRY FOR METAL OXIDE SEMICONDUCTOR (MOS) TRANSISTOR

(75) Inventors: Kurt Kimber, Minneapolis, MN (US); David Litfin, Houlton, WI (US)

(73) Assignee: Polar Semiconductor, LLC, Bloomington, MN (US)

( * ) Notice: Subject to any disclaimer, the term of this patent is extended or adjusted under 35 U.S.C. 154(b) by 965 days.

(21) Appl. No.: 13/464,422

(22) Filed: May 4, 2012

(65) Prior Publication Data
US 2013/0292770 A1 Nov. 7, 2013

(51) Int. Cl.
H02H 3/00 (2006.01)
H02H 9/04 (2006.01)
H02H 9/00 (2006.01)
H01L 27/02 (2006.01)

(52) U.S. Cl.
CPC .................................. H01L 27/0285 (2013.01)

(58) Field of Classification Search
CPC .................................. H02H 9/04; H02H 9/046
USPC ........................................................... 361/56
See application file for complete search history.

(56) References Cited

U.S. PATENT DOCUMENTS

| | | | | |
|---|---|---|---|---|
| 2010/0290165 A1* | 11/2010 | Hartberger | .......... | H01L 27/0285 361/56 |
| 2010/0296212 A1* | 11/2010 | Liang | .......... | H01L 27/0285 361/56 |
| 2013/0044397 A1* | 2/2013 | Tsai | .......... | H01L 27/0266 361/56 |
| 2013/0155566 A1* | 6/2013 | Ker | .......... | H03M 1/361 361/212 |
| 2013/0201583 A1* | 8/2013 | Rommel | .......... | H02H 9/046 361/56 |
| 2013/0292770 A1* | 11/2013 | Kimber | .......... | H01L 27/0285 257/355 |
| 2014/0192445 A1* | 7/2014 | Ikeda | .......... | H02H 9/046 361/56 |
| 2014/0268441 A1* | 9/2014 | Mallikarjunaswamy | | H03K 17/08104 361/56 |

* cited by examiner

*Primary Examiner* — Dharti Patel
(74) *Attorney, Agent, or Firm* — Kinney & Lange, P.A.

(57) ABSTRACT

A circuit for protecting a metal oxide semiconductor (MOS) device is configured to hold down or pull down a voltage at a gate of the protected MOS device during an electrostatic discharge (ESD) event. The circuit includes at least one active device or capacitance-providing element connected to the gate of the protected MOS device, configured to pull down or hold down the voltage at the gate of the protected MOS device when the ESD event occurs.

18 Claims, 4 Drawing Sheets

ANTI-SNAPBACK CIRCUITRY FOR METAL OXIDE SEMICONDUCTOR (MOS) TRANSISTOR

BACKGROUND

The present invention relates to configurations for providing robust electrostatic discharge (ESD) protection for high voltage semiconductor devices.

In high voltage semiconductor circuits, protection from damage due to ESD events is important. ESD protection circuits are generally known for this purpose. However, in some circuits, conventional ESD protection circuits may not be sufficient to protect the semiconductor devices in the circuits from damage. For example, in some situations it is difficult to provide sufficient ESD protection in a circuit configuration where a metal oxide semiconductor (MOS) device, such as a doubly diffused MOS (DMOS) device, is placed in parallel with an ESD clamp device. When the DMOS drain and the ESD clamp cathode are both positive (for example, placed across a supply voltage and ground), the gate of the DMOS device can be pulled high, turning the device on, and the DMOS device can "snap-back" (enter a mode of operation in which large amounts of current are conducted with a reduced voltage) and incur destruction at a voltage significantly lower than the rated breakdown value of the DMOS device and the ESD clamp turn-on voltage.

It would be useful to provide a circuit configuration to hold down or pull down the gate of the DMOS device during an ESD pulse, to turn the device off and increase its snap-back voltage to be nearer to the rated breakdown voltage of the device.

SUMMARY

The present invention is directed to a circuit for protecting a metal oxide semiconductor (MOS) device that is configured to hold down or pull down a voltage at a gate of the protected MOS device during an electrostatic discharge (ESD) event. The circuit includes at least one active device or capacitance-providing element connected to the gate of the protected MOS device, configured to pull down or hold down the voltage at the gate of the protected MOS device when the ESD event occurs.

DETAILED DESCRIPTION

Figure 1:
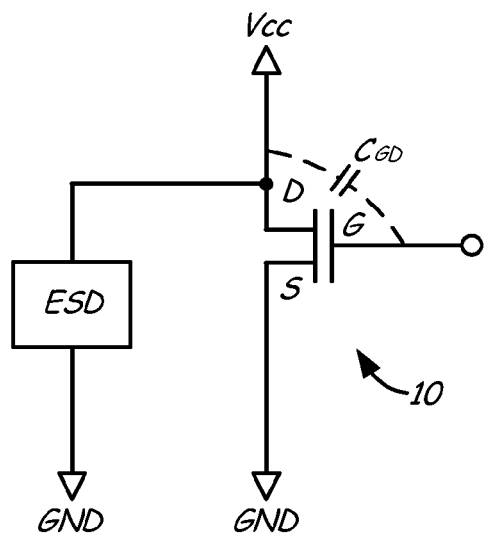
FIG. 1 is a diagram illustrating an electrostatic discharge (ESD) pulse affecting a doubly diffused metal oxide semiconductor (DMOS) device.

FIG. 1 is a diagram illustrating an electrostatic discharge (ESD) pulse (shown schematically as supply box ESD) affecting doubly diffused metal oxide semiconductor (DMOS) device 10. DMOS device 10 has gate G, source S, and drain D, with drain D being connected to positive voltage $V_{CC}$ and source S being connected to ground GND. When a positive-going electrostatic discharge pulse occurs (shown as being supplied by box ESD in FIG. 1), the voltage at gate G of DMOS device 10 is pulled high, due to the parasitic capacitance $C_{GD}$ between gate G and drain D of DMOS device 10. This results in DMOS device 10 turning on and "snapping back" into a region of operation in which destruction is incurred at a voltage significantly lower than the rated breakdown voltage (drain-to-source) of DMOS device 10 and than the turn-on voltage of a parallel ESD clamp protection circuit.

In order to counteract the effect described above, the present inventors designed circuit configurations that hold down or pull down the gate voltage of a DMOS device to be protected during an ESD pulse, so that the DMOS device is effectively turned off and the snapback voltage of the DMOS device is increased back to its maximum value, usually in the vicinity of the breakdown voltage rating of the device, thus allowing the parallel ESD clamp protection circuit to conduct its required current.

Figure 2:
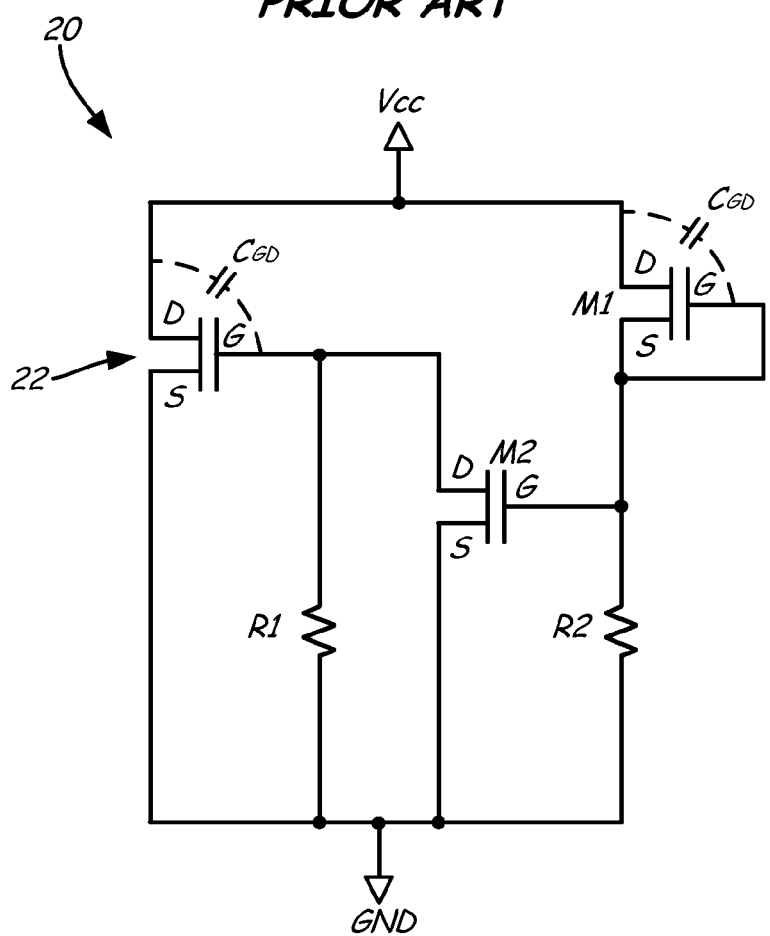
FIG. 2 is a diagram of a gate pulldown circuit according to a first embodiment of the present invention.

FIG. 2 is a diagram of gate pulldown circuit 20 for protecting DMOS device 22 according to a first embodiment of the present invention. Circuit 20 includes MOS devices M1 and M2 and resistors R1 and R2 connected in a configuration to pull down the voltage at the gate of DMOS device 22 when an ESD pulse occurs. MOS device M1 and resistor R2 function as a high pass filter—MOS device M1 functions as a capacitor in this arrangement. When an ESD pulse occurs, the capacitance of MOS device M1 behaves as a short circuit, which creates a voltage across resistor R2 and turns on MOS device M2. When MOS device M2 turns on, the voltage at the gate of DMOS device 22 is pulled down. This reduction in the gate voltage of DMOS device 22 during an ESD pulse prevents DMOS device 22 from turning on and "snapping back" into a region of operation in which destruction is incurred at a voltage significantly lower than the rated breakdown voltage (drain-to-source) of DMOS device 22. Resistor R1 is provided to keep the gate pulldown circuit in a known state before an ESD pulse occurs.

MOS device M1 is selected to have a gate-to-drain capacitance $C_{GD}$ that, in relation to the gate-to-drain capacitance $C_{GD}$ of DMOS device 22, ensures that gate pulldown circuit 20 (and specifically, MOS device M2) only turns on for high frequency ESD events.

Figure 3:
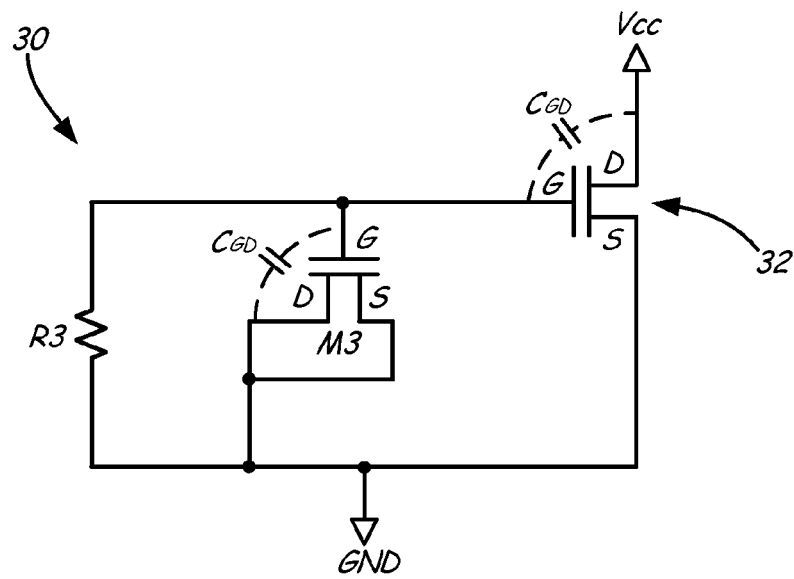
FIG. 3 is a diagram of a gate hold down circuit according to a second embodiment of the present invention.

FIG. 3 is a diagram of gate hold down circuit 30 for protecting DMOS device 32 according to a second embodiment of the present invention. Circuit 30 includes MOS device M3 and resistor R3 connected in a configuration to hold down the voltage at the gate of DMOS device 32 when an ESD pulse occurs. DMOS device 32 and MOS device M3 form a capacitor divider circuit, with the capacitance of MOS device M3 being related to the parasitic capacitance $C_{GD}$ of device 32 in a selected manner so that the gate of DMOS device 32 is pulled up much less during an ESD pulse, thus holding down the voltage at the gate of DMOS device 32. Resistor R1 is provided to keep the gate pulldown circuit in a known state before an ESD pulse occurs, and to discharge the capacitance of MOS device M3 when the gate of MOS device M3 is at a high voltage.

Figure 4:
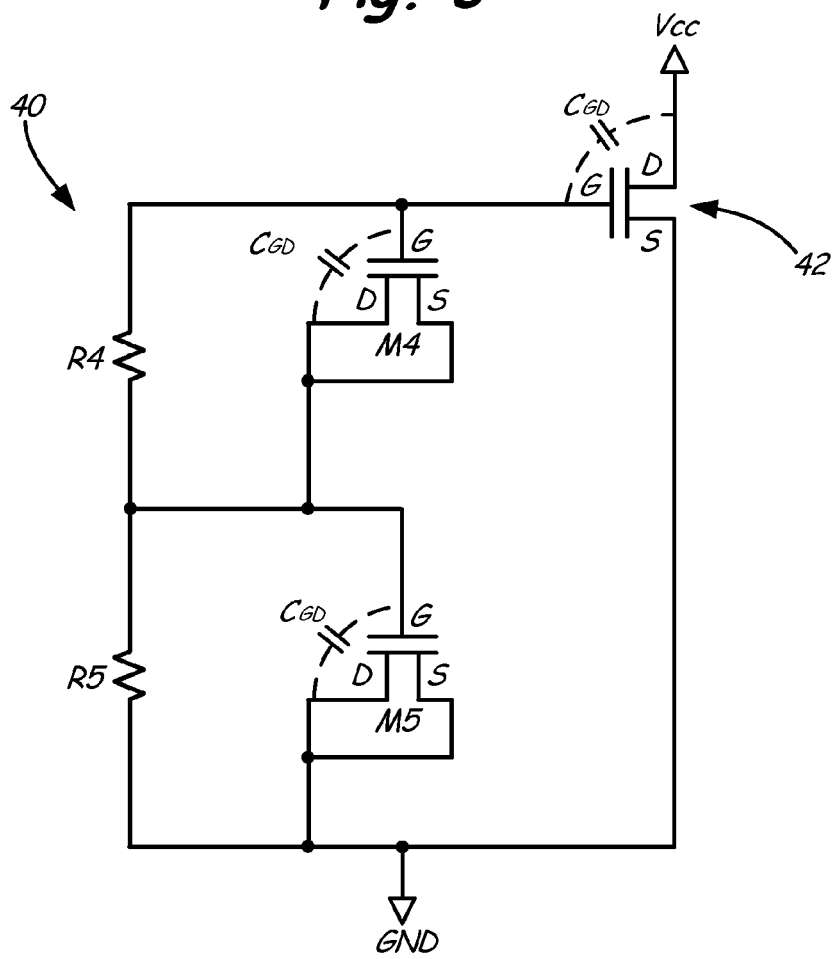
FIG. 4 is a diagram of a gate hold down circuit according to a third embodiment of the present invention.

FIG. 4 is a diagram of gate hold down circuit 40 for protecting DMOS device 42 according to a third embodiment of the present invention. Circuit 40 includes MOS devices M4 and M5 and resistors R4 and R5 connected in a configuration to hold down the voltage at the gate of DMOS device 42 when an ESD pulse occurs. Circuit 40 operates in substantially the same manner as circuit 30 described above in the discussion of FIG. 3, but employs MOS devices M4 and M5 connected in series to accommodate high operating voltages across the gate oxides of MOS devices M4 and M5.

Figure 5:
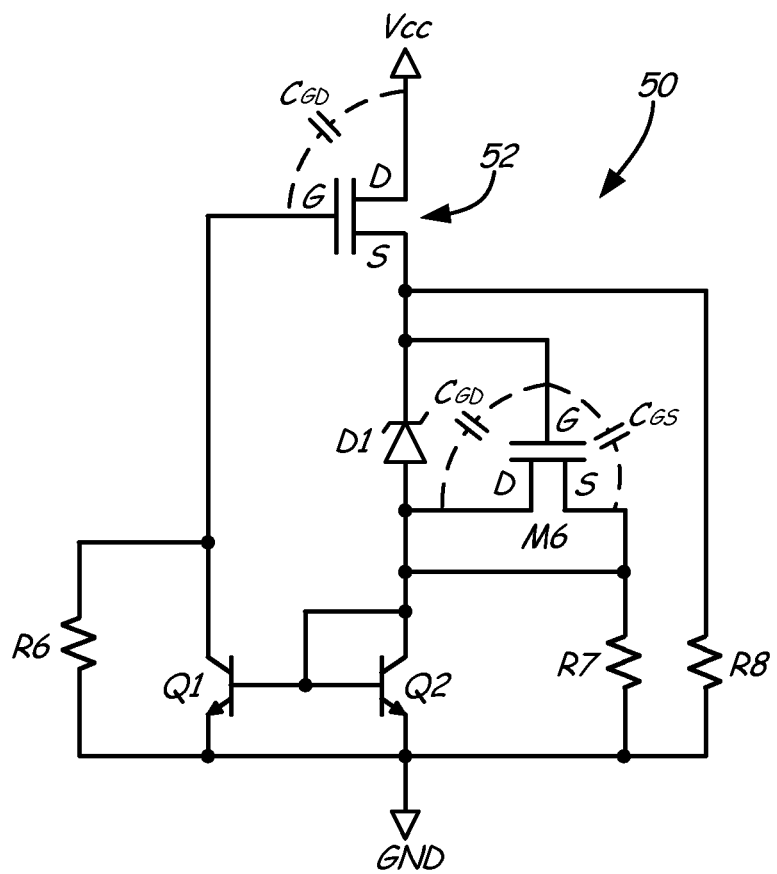
FIG. 5 is a diagram of a gate pulldown circuit according to a fourth embodiment of the present invention.

FIG. 5 is a diagram of gate pulldown circuit 50 for protecting DMOS device 52 according to a fourth embodiment of the present invention. Circuit 50 includes MOS device M6, zener diode D1, BJT transistors Q1 and Q2, and resistors R6, R7 and R8 connected in a configuration to actively pull down the voltage at the gate of DMOS device 52 when an ESD pulse occurs. Circuit 50 is applicable to configurations in which the source of DMOS device 52 is not grounded. Zener diode D1 is connected to form a DC path from the source of DMOS device 52 to the current mirror formed by BJT transistors Q1 and Q2, with zener diode D1 turning on in response to a voltage that exceeds a threshold. MOS device M6 (having parasitic capacitances $C_{GD}$ and $C_{GS}$ as shown) is connected to provide a capacitance in an AC path that conducts current in response to a rate of change in voltage that exceeds a threshold. Providing both a DC path and an AC path for the current that is mirrored to pull down the voltage at the gate of device 52 increases the turn-on speed of the pull down circuit. In alternative embodiments, only one of the DC path or the AC path may be provided, while still achieving the gate pulldown effect for protecting DMOS device 52.

In some of the embodiments shown in FIGS. 2-5, at least one MOS device is connected to provide a capacitance. It should be understood that other circuit components may be used to provide these capacitances in alternative versions of the invention. In addition, the embodiments shown in FIGS. 2-5 show a DMOS device being protected, but it should be understood that the present invention is applicable to protection of any MOS device, including NMOS and PMOS devices (with polarity reversals of the configuration as appropriate). The MOS devices shown in FIGS. 2-5 for protecting the DMOS device may be conveniently referred to as anti-snapback MOS devices, since that is their general purpose in the circuit, while the DMOS device (or other type of MOS device being protected) may be referred to as the protected MOS device.

Figure 6:
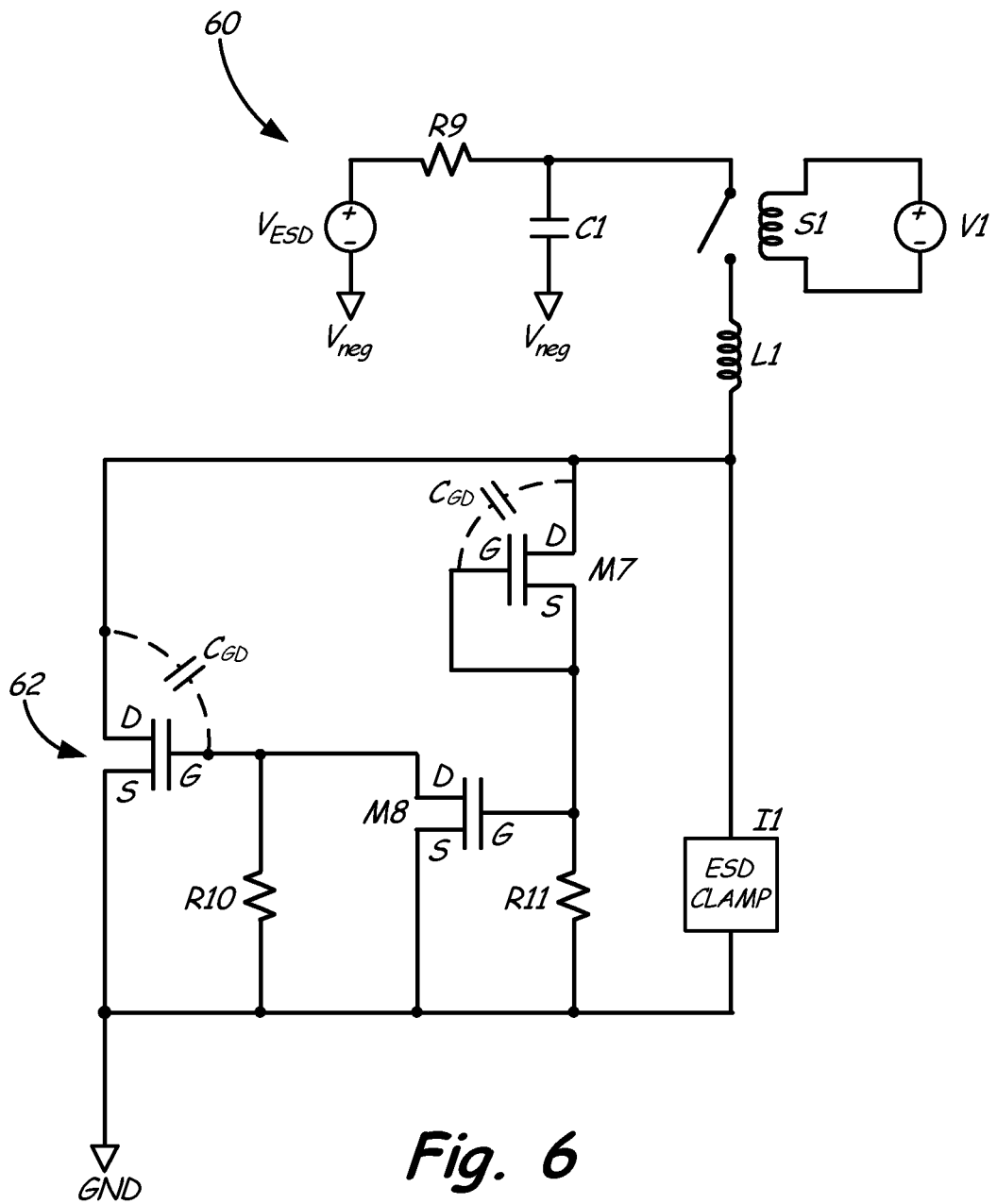
FIG. 6 is a diagram of a test circuit for simulating an electrostatic discharge (ESD) event and evaluating and tuning the performance of a protection circuit.

FIG. 6 is a diagram of test circuit 60 for simulating an electrostatic discharge (ESD) event and evaluating and tuning the performance of a protection circuit. In the example shown in FIG. 6, the anti-snapback protection circuit being tested has the configuration of the protection circuit shown in FIG. 2, and includes MOS devices M7 and M8 and resistors R10 and R11 connected in a configuration to pull down the voltage at the gate of DMOS device 62. Test circuit 60 includes voltage sources $V_{ESD}$ and V1, resistor R9, capacitor C1, switch S1, inductor L1 and ESD clamp protection circuit I1. Test circuit 60 provides a mechanism for tuning of the anti-snapback protection circuit, so that the circuit functions to pull down the voltage at the gate of device 62 during an ESD pulse, but does not interfere with normal functions of device 62 during normal operation. Test circuit 60 is configured to generate human body model (HBM) or machine model (MM) ESD pulses, to test the performance of the anti-snapback protection circuit for both types of events.

The present invention, described above with respect to a number of exemplary embodiments, provides an anti-snapback circuit for protecting a MOS device, such as a DMOS device in a particular embodiment, by limiting (holding down or pulling down) a voltage at a gate of the MOS device during an ESD event. In each of the disclosed embodiments, at least one device is coupled to the gate of the MOS device, configured so that when the ESD event occurs, the voltage at the gate of the DMOS device is held down or pulled down. In some embodiments this can be achieved with a single MOS device, while other embodiments employ multiple MOS devices or other components. In exemplary embodiments, the hold down or pull down circuitry that is provided is selected to ensure that the voltage at the gate of the DMOS device is held down or pulled down only during an ESD event.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A circuit for protecting a metal oxide semiconductor (MOS) device by pulling down a voltage at a gate of the protected MOS device during an electrostatic discharge (ESD) event, the circuit comprising:
    at least one active device connected to the gate of the protected MOS device, configured to actively pull down the voltage at the gate of the protected MOS device when the ESD event occurs,
    wherein pulling down the voltage at the gate of the protected MOS device effectively turns off the protected MOS device when the ESD event occurs.

2. The circuit of claim 1, wherein the at least one active device comprises:
    a first anti-snapback MOS device connected to a drain of the protected MOS device to provide a capacitance that behaves like a short circuit when the ESD event occurs; and
    a second anti-snapback MOS device connected to the gate of the protected MOS device, the second anti-snapback MOS device being connected to the first anti-snapback MOS device so that the second anti-snapback MOS device is turned on to pull down the voltage at the gate of the protected MOS device when the first anti-snapback MOS device capacitance behaves like a short circuit during the ESD event.

3. The circuit of claim 2, wherein the capacitance provided by the first anti-snapback MOS device is selected so that the second anti-snapback MOS device is only turned on for high frequency ESD events.

4. The circuit of claim 1, wherein the at least one active device comprises at least one of:
    a diode connected to form a DC current path from the protected MOS device when the ESD event occurs; and
    an anti-snapback MOS device connected to form an AC current path from the protected MOS device when the ESD event occurs.

5. The circuit of claim 4, further comprising:
    a current mirror configured to mirror current from the DC current path and/or the AC current path to pull down the voltage of the protected MOS device when the ESD event occurs.

6. A circuit for protecting a metal oxide semiconductor (MOS) device by holding down a voltage at a gate of the protected MOS device during an electrostatic discharge (ESD) event, the circuit comprising:
    at least one capacitance-providing element connected to the gate of the protected MOS device, configured to passively hold down the voltage at the gate of the protected MOS device when the ESD event occurs, wherein pulling down the voltage at the gate of the protected MOS device effectively turns off the MOS device when the ESD event occurs.

7. The circuit of claim 6, wherein the at least one capacitance-providing element comprises:
an anti-snapback MOS device connected between the gate of the protected MOS device and a fixed voltage reference to form a capacitor divider circuit with a gate-to-drain parasitic capacitance of the protected MOS device, to hold down the voltage at the gate of the protected MOS device when the ESD event occurs.

8. The circuit of claim 7, wherein the anti-snapback MOS device provides a capacitance that is selected relative to the gate-to-drain parasitic capacitance of the protected MOS device so that the voltage at the gate of the protected MOS device is held down during the ESD event but does not affect normal operation of the protected MOS device.

9. The circuit of claim 6, wherein the at least one capacitance-providing element comprises:
a first anti-snapback MOS device and a second anti-snapback MOS device connected in series between the gate of the protected MOS device and a fixed voltage reference to form a capacitor divider circuit with a gate-to-drain parasitic capacitance of the protected MOS device, to hold down the voltage at the gate of the protected MOS device when the ESD event occurs.

10. The circuit of claim 9, wherein the first and second anti-snapback MOS devices together provide a capacitance that is selected relative to the gate-to-drain parasitic capacitance of the protected MOS device so that the voltage at the gate of the protected MOS device is held down during the ESD event but does not affect normal operation of the protected MOS device.

11. A circuit for protecting a metal oxide semiconductor (MOS) device during an electrostatic discharge (ESD) event, the circuit comprising:
anti-snapback means for limiting a voltage at a gate of the protected MOS device when the ESD event occurs,
wherein limiting the voltage at the gate of the protected MOS device effectively turns off the MOS device when the ESD event occurs.

12. The circuit of claim 11, wherein the anti-snapback means actively pulls down the voltage at the gate of the protected MOS device when the ESD event occurs.

13. The circuit of claim 12, wherein the anti-snapback means comprises:
a first anti-snapback MOS device connected to a drain of the protected MOS device to provide a capacitance that behaves like a short circuit when the ESD event occurs; and
a second anti-snapback MOS device connected to the gate of the protected MOS device, the second anti-snapback MOS device being connected to the first anti-snapback MOS device so that the second anti-snapback MOS device is turned on to pull down the voltage at the gate of the protected MOS device when the first anti-snapback MOS device capacitance behaves like a short circuit during the ESD event.

14. The circuit of claim 12, wherein the anti-snapback means comprises at least one of:
a diode connected to form a DC current path from the protected MOS device when the ESD event occurs; and
an anti-snapback MOS device connected to form an AC current path from the protected MOS device when the ESD event occurs.

15. The circuit of claim 11, wherein the anti-snapback means passively holds down the voltage at the gate of the protected MOS device when the ESD event occurs.

16. The circuit of claim 15, wherein the anti-snapback means comprises:
at least one capacitance-providing element connected to the gate of the protected MOS device, configured to passively hold down the voltage at the gate of the protected MOS device when the ESD event occurs.

17. The circuit of claim 16, wherein the at least one capacitance-providing element comprises:
an anti-snapback MOS device connected between the gate of the protected MOS device and a fixed voltage reference to form a capacitor divider circuit with a gate-to-drain parasitic capacitance of the protected MOS device, to hold down the voltage at the gate of the protected MOS device when the ESD event occurs.

18. The circuit of claim 16, wherein the at least one capacitance-providing element comprises:
a first anti-snapback MOS device and a second anti-snapback MOS device connected in series between the gate of the protected MOS device and a fixed voltage reference to form a capacitor divider circuit with a gate-to-drain parasitic capacitance of the protected MOS device, to hold down the voltage at the gate of the protected MOS device when the ESD event occurs.

* * * * *